United States Patent
Nakamura

(10) Patent No.: US 8,542,074 B2
(45) Date of Patent: Sep. 24, 2013

(54) MEMS RESONATOR

(75) Inventor: Kunihiko Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 34 days.

(21) Appl. No.: 13/378,499

(22) PCT Filed: May 25, 2011

(86) PCT No.: PCT/JP2011/002910
§ 371 (c)(1), (2), (4) Date: Dec. 15, 2011

(87) PCT Pub. No.: WO2011/148630
PCT Pub. Date: Dec. 1, 2011

(65) Prior Publication Data
US 2012/0092083 A1 Apr. 19, 2012

(30) Foreign Application Priority Data
May 26, 2010 (JP) ................. 2010-120105

(51) Int. Cl.
*H03B 5/30* (2006.01)
*H03H 9/02* (2006.01)

(52) U.S. Cl.
USPC ........ 331/154; 331/116 M; 333/186; 333/189

(58) Field of Classification Search
USPC ................ 331/116 M, 154, 156; 333/186, 333/189, 191, 192, 197, 198, 199, 200; 310/309
See application file for complete search history.

(56) References Cited

U.S. PATENT DOCUMENTS

| 6,713,938 | B2 * | 3/2004 | Nguyen | 310/309 |
| 7,463,105 | B2 * | 12/2008 | Morita et al. | 331/154 |
| 2006/0103491 | A1 | 5/2006 | Tada et al. | |
| 2007/0001783 | A1 | 1/2007 | Lutz et al. | |
| 2008/0007139 | A1 | 1/2008 | Kawamura | |
| 2009/0039979 | A1 | 2/2009 | Tanaka et al. | |
| 2009/0251234 | A1 | 10/2009 | Hirama | |

FOREIGN PATENT DOCUMENTS

| JP | 2006-109229 | 4/2006 |
| JP | 2007-150736 | 6/2007 |
| JP | 2007-184747 | 7/2007 |
| JP | 2008-177933 | 7/2008 |
| JP | 2008-545333 | 12/2008 |
| WO | 98/57423 | 12/1998 |
| WO | 2006/112260 | 10/2006 |
| WO | 2007/145127 | 12/2007 |

OTHER PUBLICATIONS

Bannon, Frank Diii, John R. Clark, and CT-C. Nguyen. "High-Q HF microelectromechanical filters." Solid-State Circuits, IEEE Journal of 35.4 (2000): 512-526.*
International Search Report issued Aug. 2, 2011 in International (PCT) Application No. PCT/JP2011/002910.
M. Agarwal et al., "Non-Linearity Cancellation in MEMS Resonators for Improved Power-Handling", Electron Devices Meeting 2005, IEDM Technical Digest, IEEE International, pp. 286-289.
International Preliminary Report on Patentability issued Dec. 20, 2012 in International (PCT) Application No. PCT/JP2011/002910.

* cited by examiner

*Primary Examiner* — Ryan Johnson
(74) *Attorney, Agent, or Firm* — Wenderoth, Lind & Ponack, L.L.P.

(57) ABSTRACT

A MEMS resonator including: an input port which is applied with an input voltage; an output port which outputs an output current; and N MEMS resonating units (N being an integer greater than or equal to 2), the MEMS resonating unit each including a vibrator and being connected to the input port and output port, in which the N MEMS resonating units are serially connected to the input port.

9 Claims, 11 Drawing Sheets

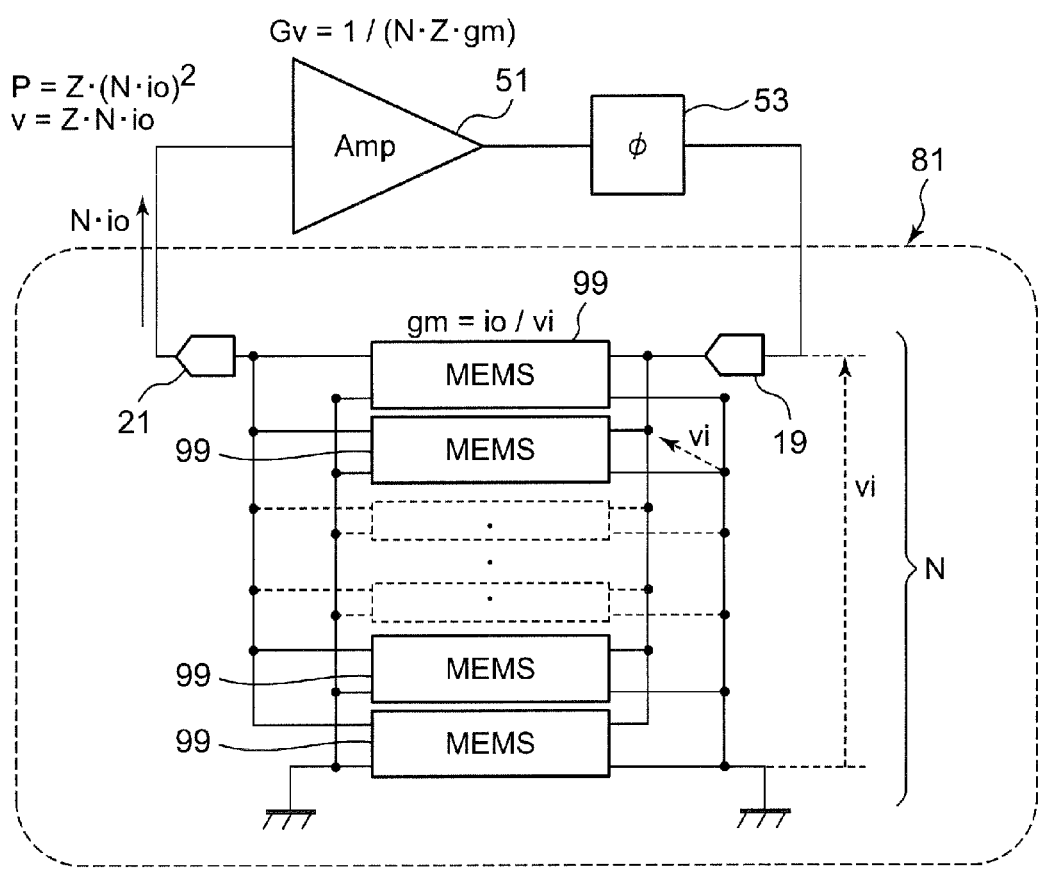

FREQUENCY OF
AN INPUT VOLTAGE vi

FREQUENCY OF
AN INPUT VOLTAGE vi

MEMS RESONATOR

TECHNICAL FIELD

The technical field relates to a MEMS (Micro-Electro Mechanical Systems) element, and particularly to a MEMS resonator using a micro mechanical element as a vibrator.

BACKGROUND ART

MEMS resonators are used for a filter circuit, which utilizes electricity passage characteristics between input and output electrodes that improves only in the vicinity of a certain frequency, i.e., the resonance frequency (mechanical resonance frequency) of the vibrator, or a temperature sensor, a pressure sensor, a mass sensor, etc., each of which utilizes the resonance frequency of the vibrator that shifts depending on a temperature, stress applied to the vibrator, or a slight amount of attached extraneous matters to the vibrator, and the like, for example.

In the case where the MEMS resonator is used as a filter of an electric circuit for an HF band, a VHF band, or a UHF band, the vibrator should be finely implemented in size to micrometers or less in order to resonate mechanically in the bands above.

Likewise, in the case where the MEMS resonator is applied to a mass sensor or the like, vibrators with a high mechanical resonance frequency are preferred for detecting a slight amount of mass. This is because that the minimal detectability of mass is proportional to the $-2.5$th power of its mechanical resonance frequency. That is, vibrators of a fine size such as micrometers or less are also preferable in such applications.

A conventional MEMS resonator is now described with reference to FIGS. 12A and 12B.

FIG. 12A is a perspective view of a principal part of a MEMS resonator 200 prepared by use of a SOI (Silicon On Insulator) substrate. The topmost silicon layer of the SOI substrate is etched to form a beam-type vibrator 201, an input electrode 203, and an output electrode 205. A BOX (Buried OXide film) layer 211 is partially etched to bring the vibrator 201 into a vibratable state, and a both ends supporting part 207 of the vibrator 201, the input electrode 203 and the output electrode 205 are fixed to a silicon substrate 209 by a remaining part of the BOX layer 211.

FIG. 12B is a sectional view along the line A-A' of FIG. 12A. A principal part of the MEMS resonator 200 is configured as that the two electrodes (input electrode 203 and output electrode 205) are respectively opposed to a side surface of the two side surfaces of the vibrator 201 with a gap gi and a gap go interposed therebetween. One electrode is taken as the input electrode 203 while the other electrode is taken as the output electrode 205, and a direct current potential difference (Vp) is made between the input electrode 203 and the vibrator 201 while the direct current potential difference (Vp) is also made between the output electrode 205 and the vibrator 201. The present figure is a specific example thereof, in which the direct current voltage Vp is applied to the vibrator 201 to realize the direct current potential difference. When an AC voltage (Vi) is applied to the input electrode 203, an exciting force acts on the vibrator 201. The exciting force is derived from a varying electrostatic force due to a variation in potential difference between the input electrode 203 and the vibrator 201. When a frequency of the AC voltage (Vi) agrees with the mechanical resonance frequency of the vibrator 201, the vibrator 201 greatly vibrates and a displacement current (io) in association with the vibration is outputted from the output electrode 205.

When the MEMS resonator is structured in suitable size for the above use, the capacitance made up by the vibrator 201 and the output electrode 205 (capacitance Co in FIG. 12B) is generally small, and it is difficult to obtain a large output current. When the capacitance Co is small, ability to store the electrical charge to be ejected to the output electrode 205 is weak, and, hence, a large output current io cannot be derived. Consequently, the need for taking measures against it such as an addition of a amplifying functionality to a signal processing unit of the next stage that is connected to the output electrode 205 arises.

There are several approaches for making the output current from the MEMS resonator large, and the first one is to make a ratio of change of capacitance with respect to a displacement of the vibrator 201 along the vibrating direction (dCo/dx (x is the vibrating direction of the vibrator) large. The change of capacity is inversely proportional to the square of the distance between the output electrode and the vibrator (the gap go of FIG. 12B). Therefore, this can be achieved by making the distance (gap go) between the output electrode 205 and the vibrator 201 small.

Next, the second approach for making the output current from the MEMS resonator large is to apply large exciting force to the vibrator 201 so that large vibration amplitude, that is, a large vibration velocity is provided. The exciting force acting on the vibrator 201 is inversely proportional to the square of a distance between the vibrator 201 and the input electrode 203 (gap gi of FIG. 12B). Therefore, this can be achieved by making the distance (gap gi) between the vibrator 201 and the input electrode 203 short.

However, it is difficult to produce such a narrow gap, which is typically as narrow as 1 μm or less, accurately and stably.

Next, the third approach for making the output current from the MEMS resonator large is to make the direct current voltage (bias voltage Vp of FIG. 12B) that is applied to the vibrator 201 large.

However, when the bias voltage Vp is increased, discharge may occur as a result of a synergistic effect with the narrowed gap, or a phenomenon that the vibrator bends to adhere to the electrode (203 or 205) only by electrostatic force due to the statically applied DC potential (Vp) may occur.

Hence there are practical limits on narrowing the gap and increasing the bias voltage Vp.

Next, the fourth approach for making the output current from the MEMS resonator large is to apply a large input voltage to the MEMS resonator (vi of FIG. 12B). The amplitude of the vibrator 201 is proportional to the input voltage (vi), and the vibration velocity increases with the increase of the input voltage so that the output current (io) also increases. However, there are limits on applying a large input voltage (vi) to the MEMS resonator. This is because, when the input voltage (vi) having amplitude of a predetermined value or more is applied, a magnitude of the output current exhibits hysteresis with respect to a sweeping direction of a frequency of the input voltage. As a result, a resonance point of an oscillation circuit becomes ill-defined and the frequency stability of an oscillation signal significantly deteriorates. Such nonlinear phenomena are attributable to a pull-in effect by the electrode (203 or 205), in which the vibrator is attracted to the electrode when the distance (gap gi or go) between the vibrator 201 and the electrode (203 or 205) becomes excessively short and the constantly-acting electrostatic force, i.e., the electrostatic force derived from the direct current potential difference Vp, acts on the vibrator 201 excessively. These phenomena are discussed as capacitive bifurcation in Non-Patent Literature 1, for example.

In order to make the MEMS resonator operations stable, it is of importance that the resonator should be operated in the operation range where the capacitive bifurcation is not actualized.

On the other hand, in Patent Literature 1, for the purpose of increasing the output current from the MEMS resonator, a plurality of resonators having the same characteristics are prepared within the MEMS resonator and the plurality of resonators are uniformly excited and output currents from the resonators are bundled up.

Patent Literature 1 discloses a configuration where a plurality of resonators identical with each other is arrayed within the MEMS resonator. Identical excitation input voltage is distributed to input electrodes of the plurality of resonators. The output currents from the plurality of resonators are bundled up and outputted. In other words, the MEMS resonator has a configuration where, on its input side, a plurality of input electrodes 203 are connected parallelly to an input terminal for the input voltage vi, and, on its output side, a plurality of output electrodes 205 are also connected parallelly to an output terminal for the output current. In such an array of the plurality of resonators, although an essential difference in size among the individual resonators due to a processing error causes differences in their resonance frequencies, an effect of a certain degree can be expected if a Q value indicating a resonance sharpness is low and displacement of individual frequencies is small as compared with the degree of unsharpness of the resonating waveform at its peak.

As thus described, according to Patent Literature 1, a certain effect can be expected in that a magnitude of the output current outputted from the MEMS resonator is made larger with respect to a magnitude of the input voltage inputted to the MEMS resonator. However, the problem on the improvement of the operational instability of the MEMS resonator to the magnitude of the input voltage inputted to the MEMS resonator remains unsolved.

CITATION LIST

Patent Literature

PTL 1: JP 2006-109229 A

Non Patent Literature

NPL 1: M. Agarwal, K. Park, R. Candler, M. Hoperoft, C. Jha, R. Melamud, B. Kim, B. Murmann, and T. W. Kenny, "Non-Linearity Cancellation in MEMS Resonators for Improved Power-Handling", Electron Devices Meeting 2005, IEDM Technical Digest, IEEE International, pp. 286-289

SUMMARY OF INVENTION

Technical Problem

In consideration of the circumstances discussed above, even when an input voltage vi to the MEMS resonator increases, a MEMS resonator in which nonlinearity is less likely to appear in its resonance characteristics, namely, a MEMS resonator having a large input voltage margin until the nonlinear resonance occurs, is provided.

Solution to Problem

An aspect is a MEMS resonator. The MEMS resonator includes: an input port that is applied with an input voltage; an output port that outputs an output current; and N MEMS resonating units (N being an integer greater than or equal to 2), the MEMS resonating unit each including a vibrator and being connected to the input port and output port. The N MEMS resonating units are serially connected to the input port.

In the aspect, the N MEMS resonating units may have a substantially identical mechanical resonance frequency.

In the aspect, the vibrators of the N MEMS resonating units may be mechanically coupled to one another by coupling units.

In the aspect, the coupling unit may have electrical impedance higher than a resistance value of the vibrator.

In the MEMS resonating unit of the aspect, the vibrator and an electrode which is opposed to the vibrator with a gap interposed therebetween may form an input-side capacitance; the input-side capacitance of at least one of the N MEMS resonating units may be connected with an input-side capacitance of another one of the MEMS resonating units via an additional capacitive element; the input-side capacitance of the at least one MEMS resonating unit and the input-side capacitance of the another one MEMS resonating unit may be serially connected to the input port via the additional capacitive element; and the additional capacitive element may have capacitance higher than the input-side capacitance of the MEMS resonating unit.

In the aspect, the additional capacitive element and the MEMS resonating unit may be formed on a single substrate.

In the aspect, the MEMS resonator may further include an impedance element which defines a direct current potential of a wiring between the input-side capacitance of the at least one MEMS resonating unit and the additional capacitive element. Impedance of the impedance element may be higher than impedance of the additional capacitive element.

In the aspect, the impedance element and the MEMS resonating unit may be formed on a single substrate.

In the MEMS resonating unit of the aspect, the vibrator and an input electrode which is opposed to the vibrator with a gap interposed therebetween may form an input-side capacitance and the vibrator and an output electrode which is opposed to the vibrator with a gap interposed therebetween may form an output-side capacitance; an input electrode of one MEMS resonating unit of the N MEMS resonating units may be connected to the input port, a vibrator of the one MEMS resonating unit of the N MEMS resonating units may be connected to an input electrode of another one MEMS resonating unit, and the N MEMS resonating units may be serially connected to the input port; and output electrodes of the N MEMS resonating units may be connected to the output port.

In the MEMS resonating unit of the aspect, the vibrator and an electrode which is opposed to the vibrator with a gap interposed therebetween may form a capacitance; and one of a vibrator and an electrode of one MEMS resonating unit of the N MEMS resonating units may be connected to the input port, and the other one of the vibrator and the electrode of the one MEMS resonating unit may be connected to any one of a vibrator and an electrode of another one MEMS resonating unit, and the N MEMS resonating units may be serially connected to the input port.

In the aspect, the N MEMS resonating units may be parallelly connected to the output port.

Another aspect is an oscillator. The oscillator includes the MEMS resonator according to the aspect.

Advantageous Effects of Invention

In the MEMS resonator, the plurality of MEMS resonators are serially connected to the input port on the input side. This can expand an input voltage margin until each resonating unit exhibits nonlinear behavior. The present MEMS resonator has an advantageous effect that the nonlinearity is less likely to appear in the resonance characteristics even when the input voltage vi increases, namely, the MEMS resonator has a large input voltage margin until the nonlinearity in its resonance appears when the input voltage vi into the MEMS resonator is increased.

BRIEF DESCRIPTION OF DRAWINGS

FIG. 2 is a configuration diagram of an oscillator using a MEMS resonator having a plurality of MEMS resonating units;

DESCRIPTION OF EMBODIMENTS

First Embodiment

Embodiments will be described in detail below.
(Capacitive Bifurcation)

First, capacitive bifurcation will be described taking the case of using a MEMS resonator as an oscillator as an example.

Figure 1A:
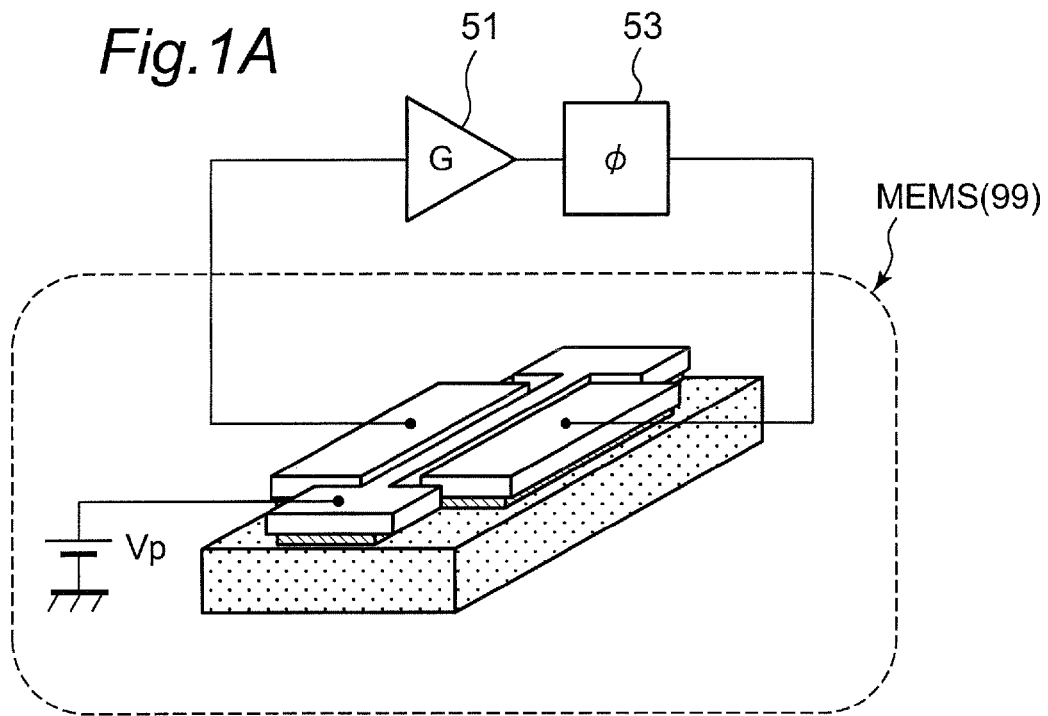
FIG. 1A is a configuration diagram of an oscillator using a MEMS resonator having a single MEMS resonating unit.
Figure 1B:
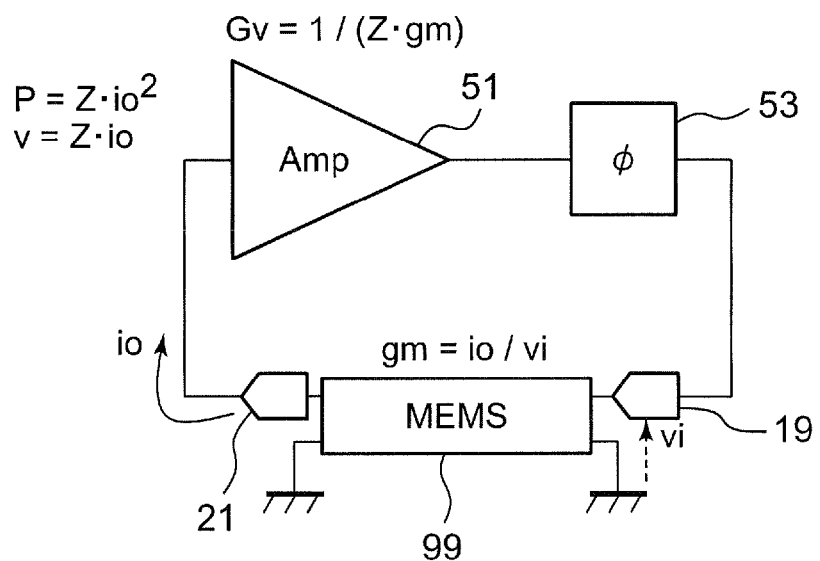
FIG. 1B is a block diagram of the oscillator using the MEMS resonator having the single MEMS resonating unit.

FIGS. 1A and 1B both are diagrams illustrating a configuration of a MEMS resonator which has a single MEMS resonating unit 99 and operates as an oscillator. As shown in FIG. 1A, an amplifier circuit 51 having a sufficient gain G to compensate the attenuation by the MEMS resonator and an appropriate phase adjustment circuit Φ 53 are inserted between the input and output terminals of the MEMS resonator to form a feedback loop, so as to constitute an oscillator in a mechanical resonance frequency of the MEMS resonating unit 99.

The carrier noise ratio (C/N) of an oscillation signal, which may be used as a performance index of the oscillator, improves with the increase of electric power inputted into the amplifier circuit 51. FIG. 1B is a block diagram of the oscillator using the MEMS resonator having a single MEMS resonating unit 99. The MEMS resonating unit 99 is excited by an input voltage vi applied to an input port 19, and outputs from an output port 21 a current io that is generated in association with vibrations. That is, the MEMS resonator is a voltage-input and current-output type device, and its input/output relation is expressed as the transfer conductance gm=io/vi. Here, io is an output current of the MEMS resonator, and vi is an input voltage into the MEMS resonator. When an input impedance of the amplifier circuit 51 (amplifier) is referred to as Z, the voltage at the input stage of the amplifier is Z·io, and electric power is $Z \cdot io^2$. If the input voltage vi into the MEMS resonator is doubled, io also doubles, and hence electric power of the amplifier input stage quadruples, and the C/N improves by 10·log 4=6 dB.

Further, already mentioned above, when, as shown in FIG. 2, N MEMS resonating units 99 are parallelly connected at the input side, namely parallelly connected to the input port 19, and are also parallelly connected at the output side, namely parallelly connected to the output port 21, the total output current io from the MEMS resonator 81 becomes N times as large as that in the examples of FIGS. 1A and 1B. Therefore, electric power at the input stage of the amplifier 51 becomes the square of N times as large as that in the examples of FIGS. 1A and 1B, and the C/N ratio improves by 20·logN as compared with that in the examples of FIGS. 1A and 1B.

Figure 3A:
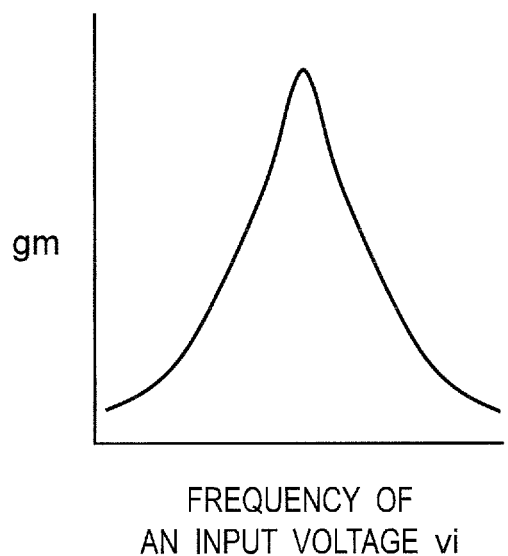
FIG. 3A is a plot of transfer conductance of the MEMS resonating unit with respect to an input voltage frequency (linear region)
Figure 3B:
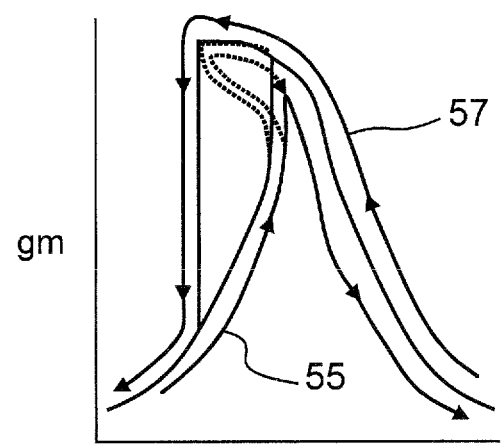
FIG. 3B is a plot of transfer conductance of the MEMS resonating unit with respect to the input voltage frequency (nonlinear region)

FIGS. 3A and 3B both are plots of the transfer conductance gm of the MEMS resonating unit 99 shown in FIGS. 1A and 1B etc. with respect to a frequency of the input voltage vi (resonance curves). FIG. 3A is a resonance curve in an amplitude range of the input voltage vi in which the MEMS resonating unit 99 etc. exhibits stable resonance characteristics. As shown in FIG. 3A, when sweeping the input voltage vi with respect to frequency, the resonance curve (transfer conductance gm of the MEMS resonating unit 99 etc.) under the input voltage vi having appropriate amplitude shows a symmetrical profile with the mechanical resonance frequency (peak in the figure) of the vibrator located in center and the hysteresis depending on a sweeping direction is not observed.

However, when an input voltage vi with excessively large amplitude is applied, the resonance curve exhibits nonlinearity as shown in FIG. 3B, which has hysteresis depending on the differences in sweeping directions. An arrow 55 here indicates a route followed by a change in gm when sweeping the input voltage vi from the low frequency side to the high frequency side. The dotted line in the middle is a portion of the route theoretically derived. An arrow 57 indicates a route followed by a change in gm when sweeping the input voltage vi from the high frequency side to the low frequency side. Under circumstances where such hysteresis appears obviously, the resonance point in the oscillation circuit cannot be fixed with regard to the input voltage vi of a prescribed frequency range, thereby the frequency stability of the oscillation signal deteriorates.

Such nonlinear phenomena are attributable to that an electrode attracts the vibrator with a constantly-acting electrostatic force, which acts excessively when the distance between the vibrator and the electrode becomes excessively short under the condition that the constantly-acting electrostatic force, i.e., electrostatic force derived from the direct current potential difference Vp, acts on the vibrator. These phenomena are discussed as capacitive bifurcation in Non Patent Literature 1, for example.

Owing to the existence of such phenomena, the magnitude of the input voltage vi that is applied to each of the MEMS resonating unit 99 of FIGS. 1A and 1B and the total input port 19 of the MEMS resonator 81 of FIG. 2 should be limited from the viewpoint of ensuring stable operation of the MEMS resonator 99 etc.

After a variety of experiments, it is focused now that, when a MEMS resonator is structured with N MEMS resonating units for the purpose of keeping the output current io from the MEMS resonator large, an input voltage margin until the occurrence of the nonlinear resonance can be expanded by dividing the input voltage vi into N. In the present embodiments, in order to divide the input voltage vi that is applied to the input port 19 into N and distribute those to N MEMS resonating units, each of the input electrodes of the plurality of MEMS resonating units is serially connected to the input port 19. The serial connection leads to an increase in input impedance. This greatly deviates from 50Ω impedance matching in a high frequency circuit, and is thus said to be not preferred when transferring signals included in a relatively wide bandwidth since this generally introduces frequency dependency on transfer characteristics within the bandwidth. However, the 50Ω matching is not an essential condition in uses such as an oscillation circuit and a sensor; where a circuit size is sufficiently small as compared with a wavelength of a signal and signal transfer quality across the bandwidth wide is not required. Especially, since a MEMS resonator is a device of a voltage-driven and current-output type, it is an essential to raise the input impedance for ensuring an output current.

Figure 4:
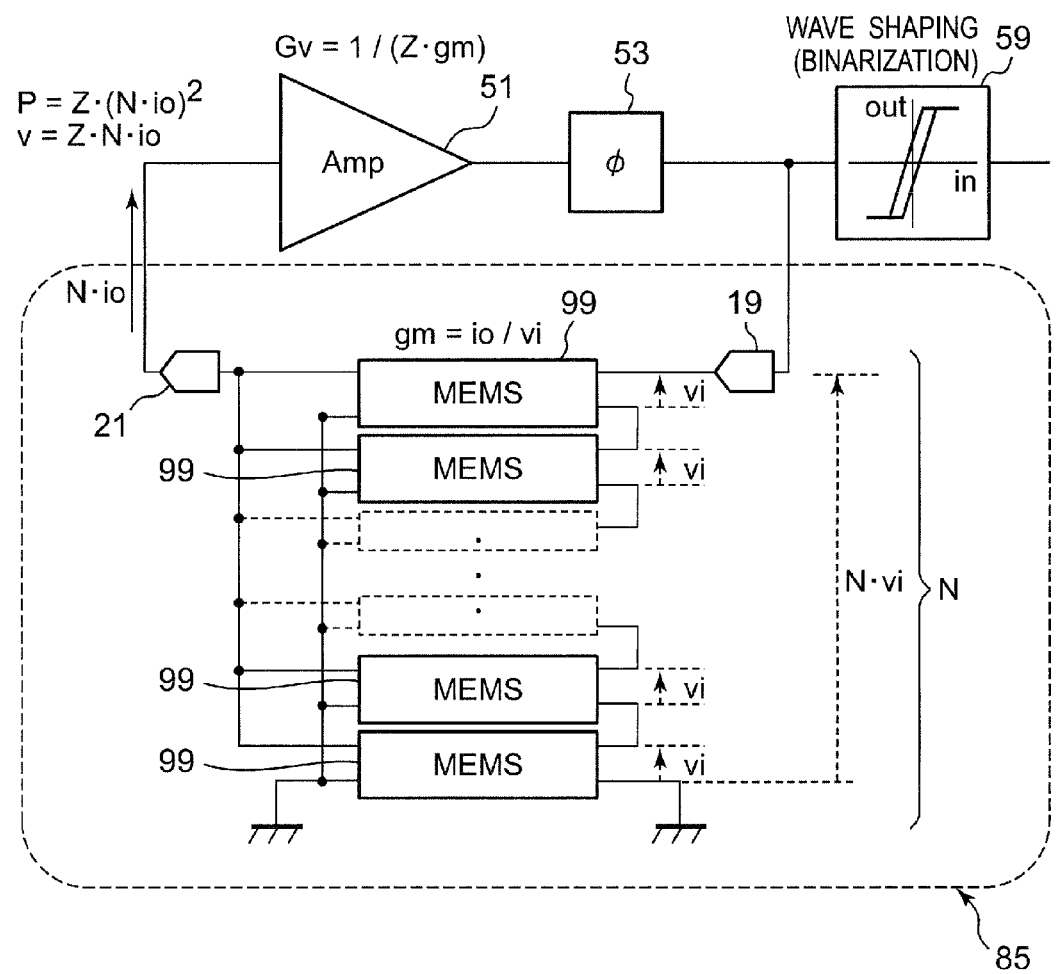
FIG. 4 is a configuration diagram of an oscillator using a MEMS resonator according to a first embodiment.

FIG. 4 is a configuration diagram of an oscillation circuit using a MEMS resonator 85 according to the present embodiment having N MEMS resonating units 99. An output of the amplifier 51, namely an input voltage into the MEMS resonator 85, is assumed to be N·vi. Inputs of the N MEMS resonating units 99 are serially connected to the input port 19. Accordingly, the input voltage N·vi applied into the input port 19 is divided into N in accordance with the number of MEMS resonating units 99 (N), and each of the individual resonating units 99 inputs an input voltage vi. Therefore, a margin of the MEMS resonator 85 with respect to the magnitude of the input voltage vi is expanded on the whole. At the same time, outputs of the individual MEMS resonating units 99 are parallelly connected to the output port 21. Accordingly, the output current io from each of the individual MEMS resonating units 99 is multiplied by N and the current N·io is inputted into the amplifier 51.

Mechanical resonance frequencies of the N MEMS resonating units 99 are preferably substantially identical. By this, an output current is effectively increased when input voltages of a frequency identical to the mechanical resonance frequency are applied. The expression "substantially identical" here means a state where a half-value width of a mechanical resonance frequency of one arbitrary MEMS resonating unit included in the N MEMS resonating units is overlapped with a half-value width of a mechanical resonance frequency of at least one MEMS resonating unit other than the one arbitrary MEMS resonating unit. It is to be noted that the "half-value width of a resonance frequency" means a frequency band, in which a transfer conductance is from the transfer conductance at the resonance frequency to a transfer conductance 3 dB down from the transfer conductance at the resonance frequency.

In the MEMS resonator 85 according to the present embodiment shown in FIG. 4, the output currents io from the N resonating units 99 are bundled up in the output port 21 and outputted as N·io so that the electric power at the input stage of the amplifier 51 is made $N^2$ times as large and C/N of the oscillator improves by 20·logN in comparison with the MEMS resonator of the configuration of FIGS. 1A and 1B.

Further, even when the input voltage N·vi, which, when applied to the input port 19, causes each individual MEMS resonating unit 99 of the MEMS resonator 81 having the configuration of FIG. 2 to exhibit the nonlinear resonance, is applied to the input port 19 of the MEMS resonator 85 according to the present embodiment shown in FIG. 4, it can operate in a linear region since vi is applied to each individual MEMS resonating unit 99 (in the case of the number of MEMS resonating units 99 being N). In this manner, an oscillator using the MEMS resonator 85 according to the present embodiment shown in FIG. 4 can be a low noise oscillator, which utilizes the linear region of the resonance phenomena occurring in each of the MEMS resonating units 99. Furthermore, the input voltage has a voltage level of N·vi, which is N times as high as vi, so that a waveform shaping process such as binarization processing using a Schmitt trigger is facilitated.

Figure 5:
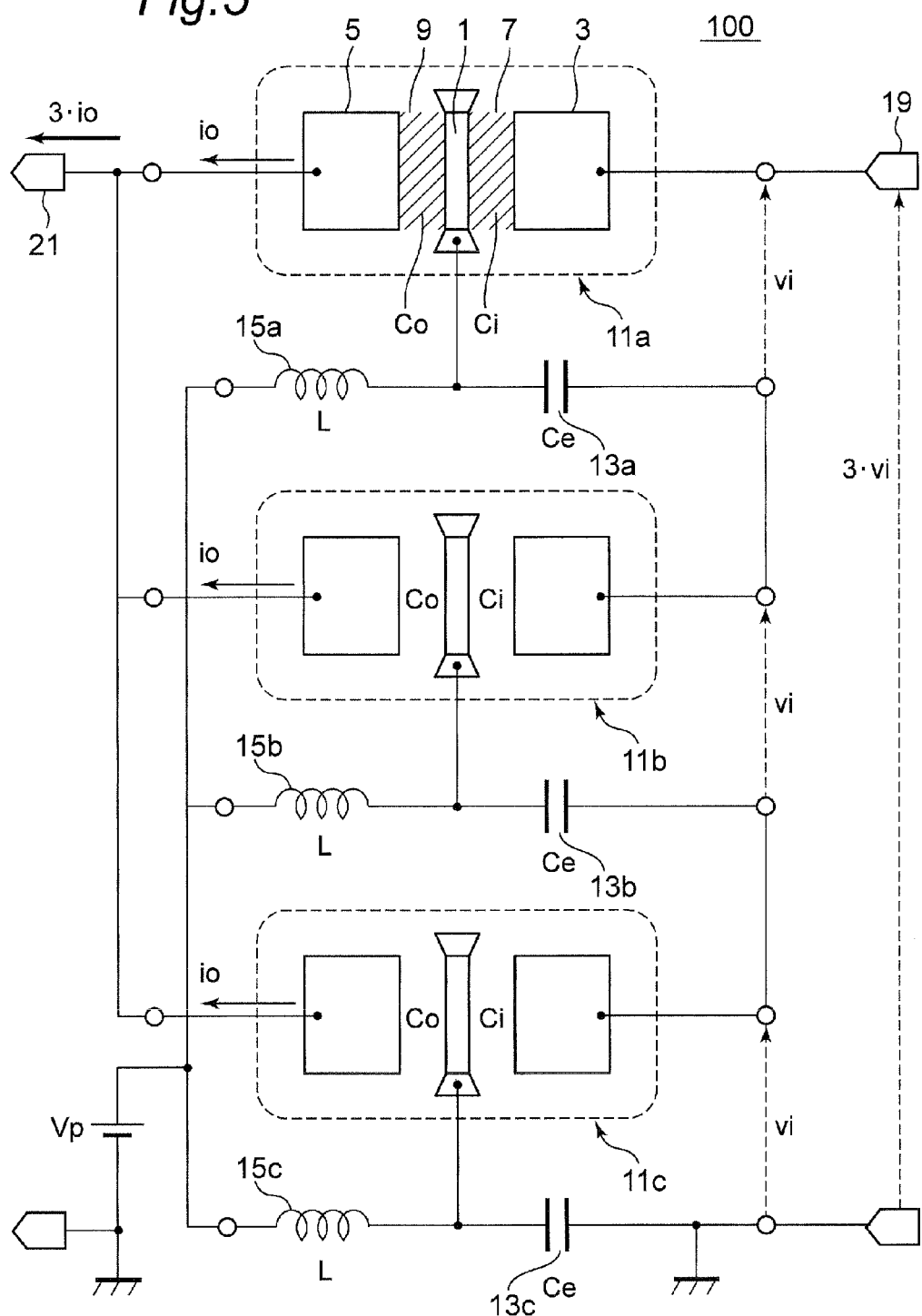
FIG. 5 is a circuit diagram of the MEMS resonator according to the first embodiment.
Figure 12A:
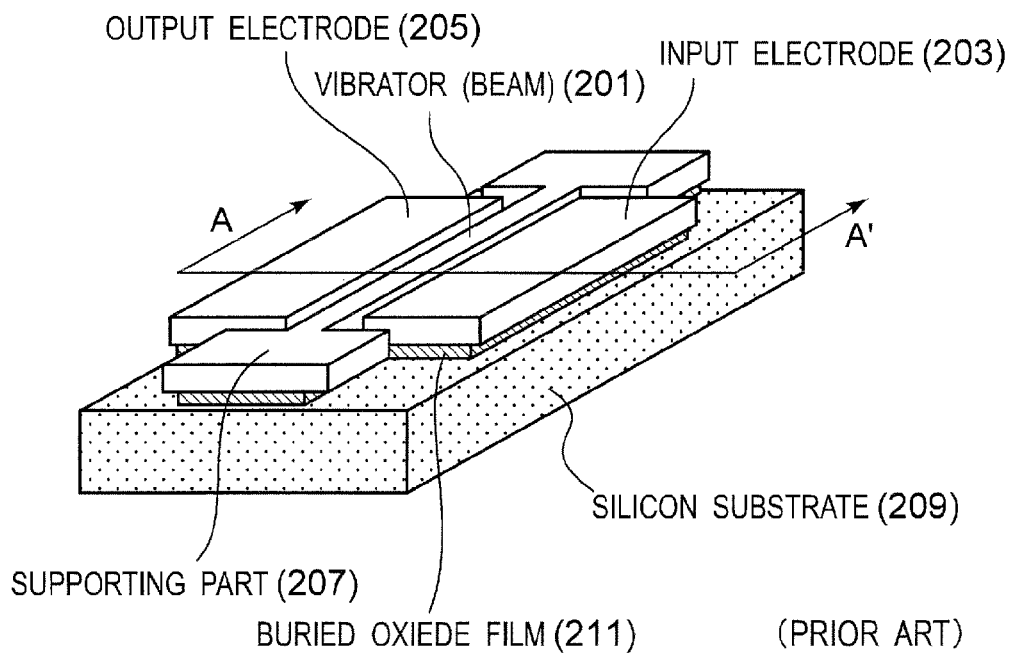
FIG. 12A is a perspective view of a conventional MEMS resonator.
Figure 12B:
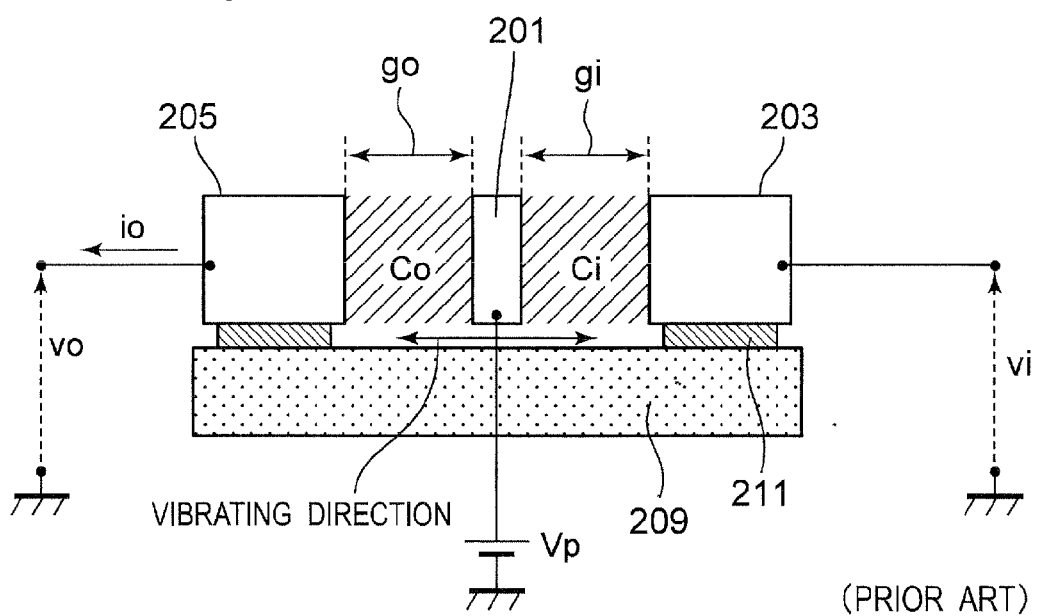
FIG. 12B is a sectional view of the conventional MEMS resonator.

FIG. 5 is a circuit diagram of the MEMS resonator 85 according to the present embodiment. In this figure, the number of MEMS resonating units N is 3. Cross sections of MEMS resonating units 11a, 11b, and 11c may be substantially identical to that of FIG. 12B. Since the MEMS resonating units 11a, 11b, and 11c may have substantially identical structure, the structure of the resonating unit will be described by taking the MEMS resonating unit 11a as an example here.

The MEMS resonating unit 11a is provided with an input electrode 3, a vibrator 1, and an output electrode 5. Gaps having predetermined intervals are provided between the input electrode 3 and the vibrator 1 and between the vibrator 1 and the output electrode 5. The gap between the input electrode 3 and the vibrator 1 forms an input-side capacitance 7 (capacitance Ci). At the same time, the gap between the vibrator 1 and the output electrode 5 forms an output-side capacitance 9 (capacitance Co).

The vibrator 1 of the MEMS resonating unit 11a and the input electrode 3 of the MEMS resonating unit 11b are connected with each other via an additional capacitance 13a (capacitance Ce). Similarly, (the vibrator of) the MEMS resonating unit 11b and (the input electrode of) the MEMS resonating unit 11c are also connected with each other via an additional capacitance 13b (capacitance Ce). The vibrator of the MEMS resonating unit 11c, which is located in the farthest position from the input port 19, is grounded via an additional capacitance 13c (capacitance Ce).

It is preferable that the capacitance Ce of each of the additional capacitance 13a etc. is higher than the capacitance Ci of the input-side capacitance 7. It is further preferable that the capacitance Ce of each of the additional capacitance 13a etc. is sufficiently larger than the capacitance Ci of the input-side capacitance 7. With this configuration, the input voltage is divided into the number of MEMS resonating units, and the divided input voltage becomes input voltages to the individual MEMS resonating units. Each of the additional capacitance 13a etc. (capacitance Ce) has an impedance ignorably low when compared with the impedance of the input-side capacitance 7 (capacitance Ci), and an input voltage 3vi (N·vi) that is applied to the input port 19 is divided into three, and the voltage vi is then applied to each of the resonating units 11a, 11b, and 11c. Therefore, in the present embodiment (in the case of N=3), when the input voltage applied to the input port 19 is 3vi (N·vi), the voltage vi (one Nth (=third) of the input voltage) is applied to each of the resonating units 11a, 11b, and 11c. If the voltage vi is less than or equal to the maximal voltage (applicable voltage) by which each of the resonating units 11a, 11b, and 11c performs resonance in the linear region (does not resonate in the nonlinear region), all of the resonating units 11a, 11b, and 11c operates stably in the linear region. Therefore, the MEMS resonator 100 according to the present embodiment shown in FIG. 5 operates stably so long as the voltage that is applied to the input port 19 does not exceed 3vi(N·vi). That is, the MEMS resonator 100 according to the present embodiment is provided with N (N is an integer greater than or equal to 2) MEMS resonating units 11a etc., and can operate stably when the input voltage applied to the input port 19 does not exceed N times as large as the applicable voltage of the MEMS resonating unit 11a etc.

Further, a bias voltage Vp is applied to an electrical contact located between the vibrator 1 of each of the MEMS resonating unit 11a etc. and the additional capacitance 13a (capacitance Ce) via an inductance element 15a (inductance L). The inductance elements 15a, 15b, and 15c (inductance L) constitutes impedance elements. It is prefereble that the impedance of each of the inductance elements 15a, 15b, and 15c (inductance L) is higher than the impedance of each of the additional capacitance 13a etc. (capacitance Ce). By this, the current flowing from the input electrode 3 in accordance with the input voltage vi flows towards an adjacent input electrode 3 of the resonating unit via the additional capacitance 13a, 13b, or 13c (capacitance Ce). In short, making the impedance of each of the inductance elements 15a, 15b, and 15c (inductance L) higher than the impedance of each of the additional capacitances 13a, 13b, and 13c (capacitance Ce) can suppress a leakage current to the bias voltage source Vp. It is thereby possible to achieve the effect of suppressing power loss of the MEMS resonator 100. It is to be noted that resistive elements sufficiently larger than the impedance of each of the additional capacitances 13a, 13b, and 13c (capacitance Ce) may be used in place of each of the inductance elements 15a, 15b, and 15c (inductance L) to apply the bias DC voltage to the vibrator 1 while suppressing a current leakage.

Figure 6:
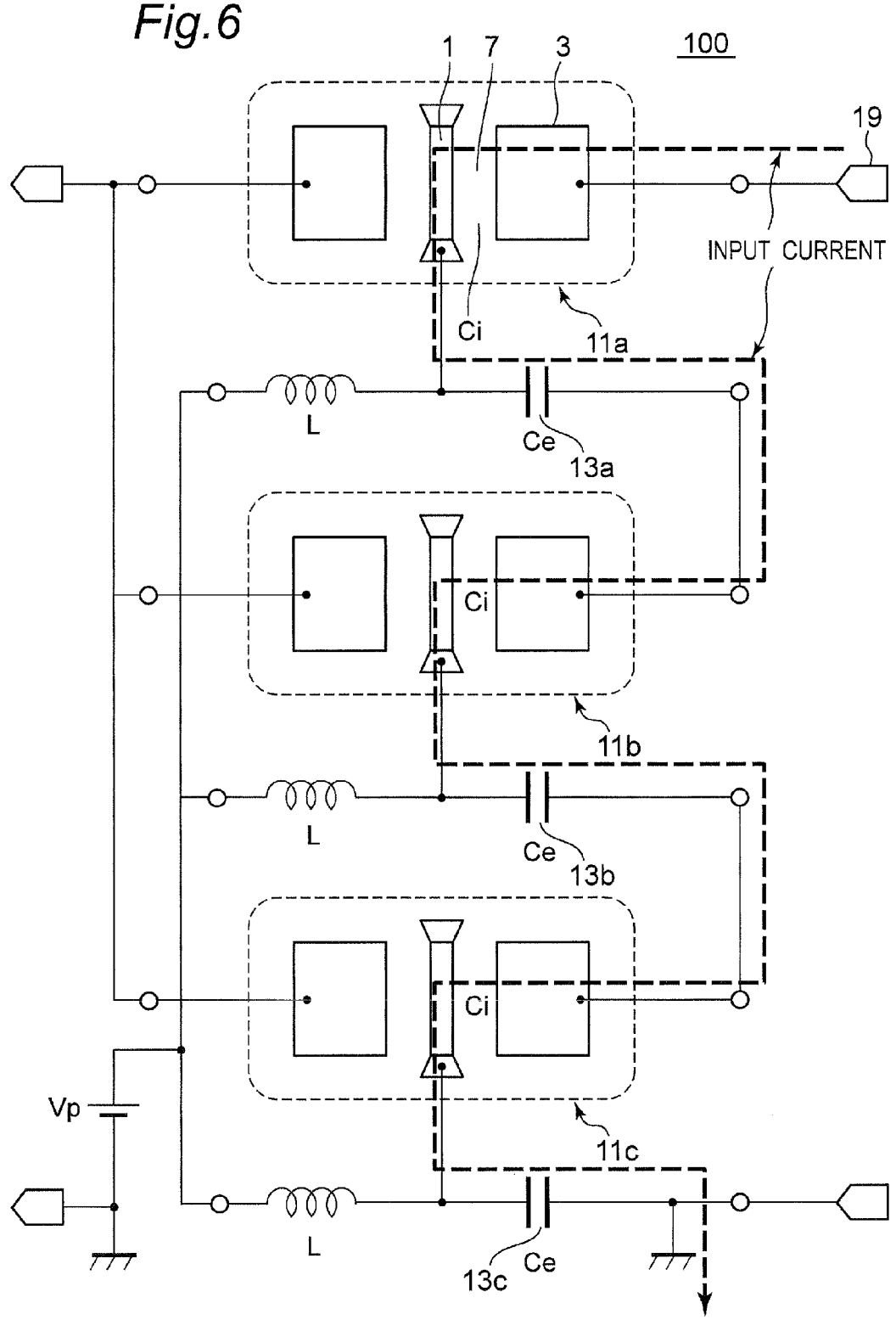
FIG. 6 is a diagram illustrating a flow of an input current flowing through the MEMS resonator according to an input voltage.

By connecting the additional capacitance 13a etc. (capacitance Ce) and the high inductance element 15a, 15b, or 15c (inductance L in the figure) both with the each individual MEMS resonating units 11a etc. as shown in FIG. 5, the input current in association with the application of the voltage 3·vi to the input port 19 flows as indicated with a broken line of FIG. 6. In other words, the current flowing through the vibrators 1 of each individual MEMS resonating units 11a etc. has an identical current value. Accordingly, a change of temperature in each of the vibrators 1 caused by the current can be made uniform so that an amount of shift of the mechanical resonance frequency due to the temperature change in each of the resonating units 11a etc. can be held uniform.

Figure 7:
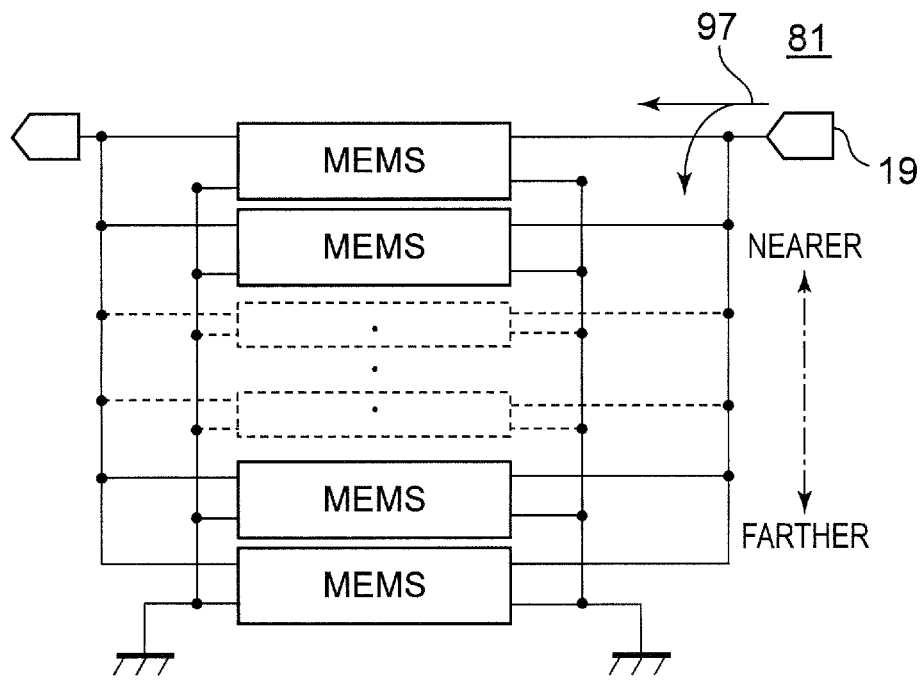
FIG. 7 is a diagram illustrating a flow of a current in the MEMS resonator of FIG. 2.

By contrast, there are disadvantages in the MEMS resonator 81 having the configuration shown in FIG. 2 as follows. FIG. 7 is a partial view of the MEMS resonator 81 shown in FIG. 2. In the case where input stages of a plurality of resonating units (MEMS) are parallelly connected with respect to the input port 19 as shown in FIG. 7, a value of a current 97 that is inputted into each of the resonating units (MEMS) is influenced by wiring resistances residing in the wirings to each of the resonating units (MEMS). The farther from the current input point (input port 19) a MEMS resonating unit is located, the more the current 97 attenuates so that a change of temperature due to a current becomes nonuniform. This results in deterioration in effect of application of the frequency correction technique such as a PLL.

From the reasons above, the MEMS resonator 100 according to the present embodiment is advantageous in that the shift amount of the mechanical resonance frequency due to the temperature change caused by the currents in the plurality of resonating units can be held uniform.

(Variations)

Figure 8:
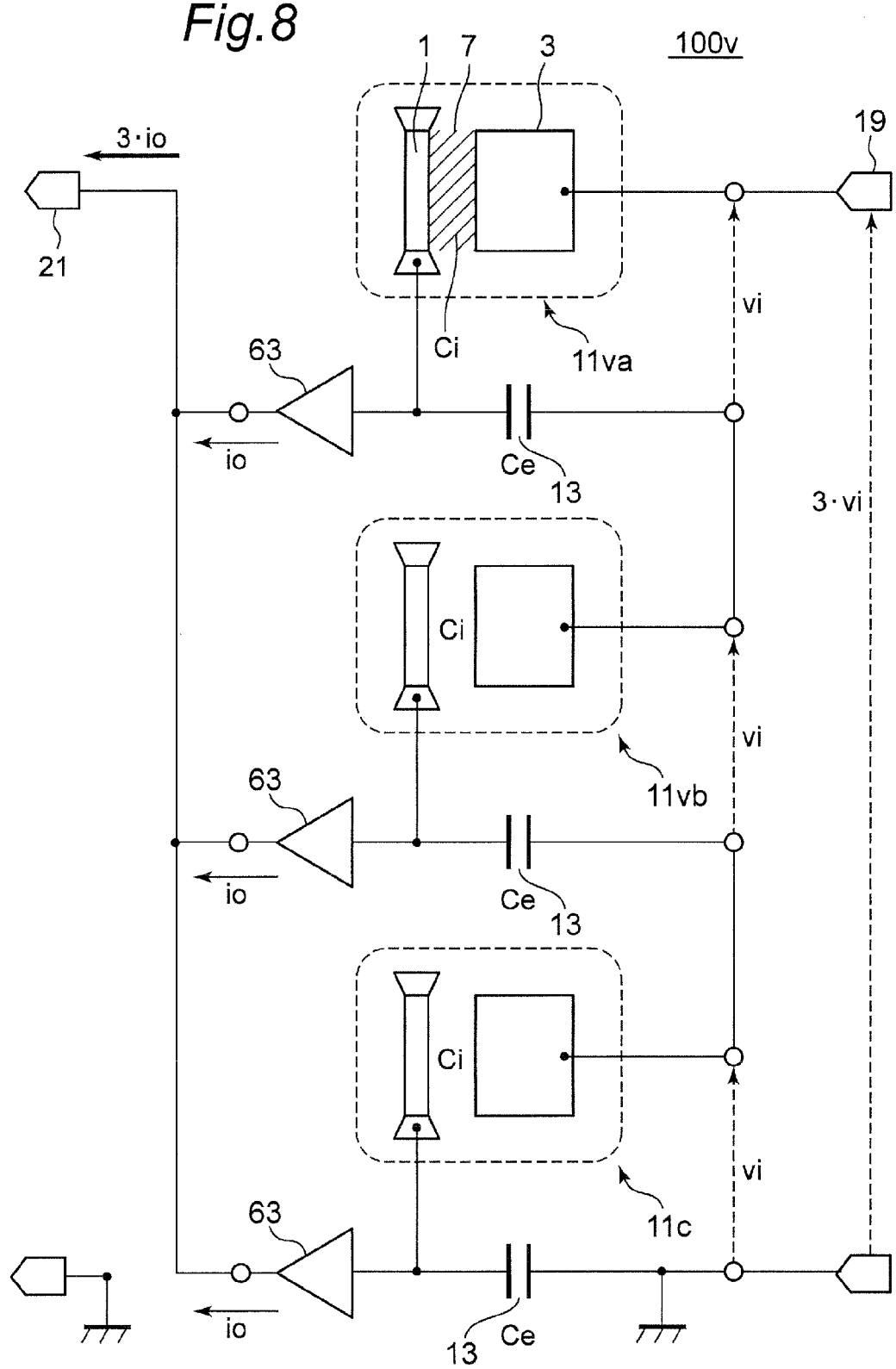
FIG. 8 is a circuit diagram of an example of a variation of the MEMS resonator according to the first embodiment.

Next, an example of variations of the present embodiment will be described. FIG. 8 is a circuit diagram of a MEMS resonator 100v according to the present embodiment variation. The MEMS resonator 100v is structured such that vibrators 1 that is opposed to input electrodes 3, each of which functions as an electrode to receive an input voltage, may function as an output electrode to output currents from an individual MEMS resonating unit in MEMS resonating units 11va, 11vb, and 11vc. A gap between the input electrode 3 and the vibrator 1 forms an input-side capacitance 7 (capacitance Ci), and the capacitance 7 functions also as an output-side capacitance 9 of the resonator 100v.

In the present variation example 100v, input terminals of amplifiers 63 are connected to the vibrators 1 in place of the inductance elements 15a, 15b, and 15c (inductance L) of the configuration 100 in FIG. 5. Output terminals of the amplifiers 63 are connected in parallel with respect to an output port 21, and a current from each of the amplifiers 63 is summed up to output from the output port 21. It is preferable that the input impedances of the amplifiers 63 may be higher than the impedance of the additional capacitance Ce. This allows each of the amplifiers 63 to exert an equivalent function to the inductance element L of FIG. 5 (blocking function of a leakage current). Further, since the input terminal of the amplifier 63 is raised by a bias DC potential that is determined inside the amplifier 63, a bias DC voltage to the vibrator 1 is determined in accordance with this bias potential. Assuming that a supply voltage driving the amplifier 63 is Vdd here, a voltage of the input terminal bias DC voltage of the amplifier is generally set to about Vdd/2. Hence in such the situation, a direct current voltage of about Vdd/2 is applied to the vibrator 1.

It should be noted that, in each of the MEMS resonating units 11va, 11vb, and 11vc of the MEMS resonator 100v of FIG. 8, arrangements of the vibrator 1 and the input electrode 3 may be exchanged, and while the vibrator 1 may function as an input electrode, the electrode opposed to the vibrator may function as an output electrode that outputs an output current. That is, the configuration may be formed such that the input electrode 3 in FIG. 8 is made vibratable and regarded as the vibrator, and simultaneously the vibrator 1 in FIG. 8 is made as a non-vibrating output electrode. Further, in the single MEMS resonator 100v having a plurality of (N (N is an integer greater than or equal to 2)) MEMS resonating units, at least one MEMS resonating unit is structured so that the vibrator may function as an input electrode and the electrode opposed to the vibrator may function as an output electrode, and the other MEMS resonating unit is structured so that the vibrator may function as an output electrode while the electrode opposed to the vibrator may function as an input electrode.

Second Embodiment

Figure 9:
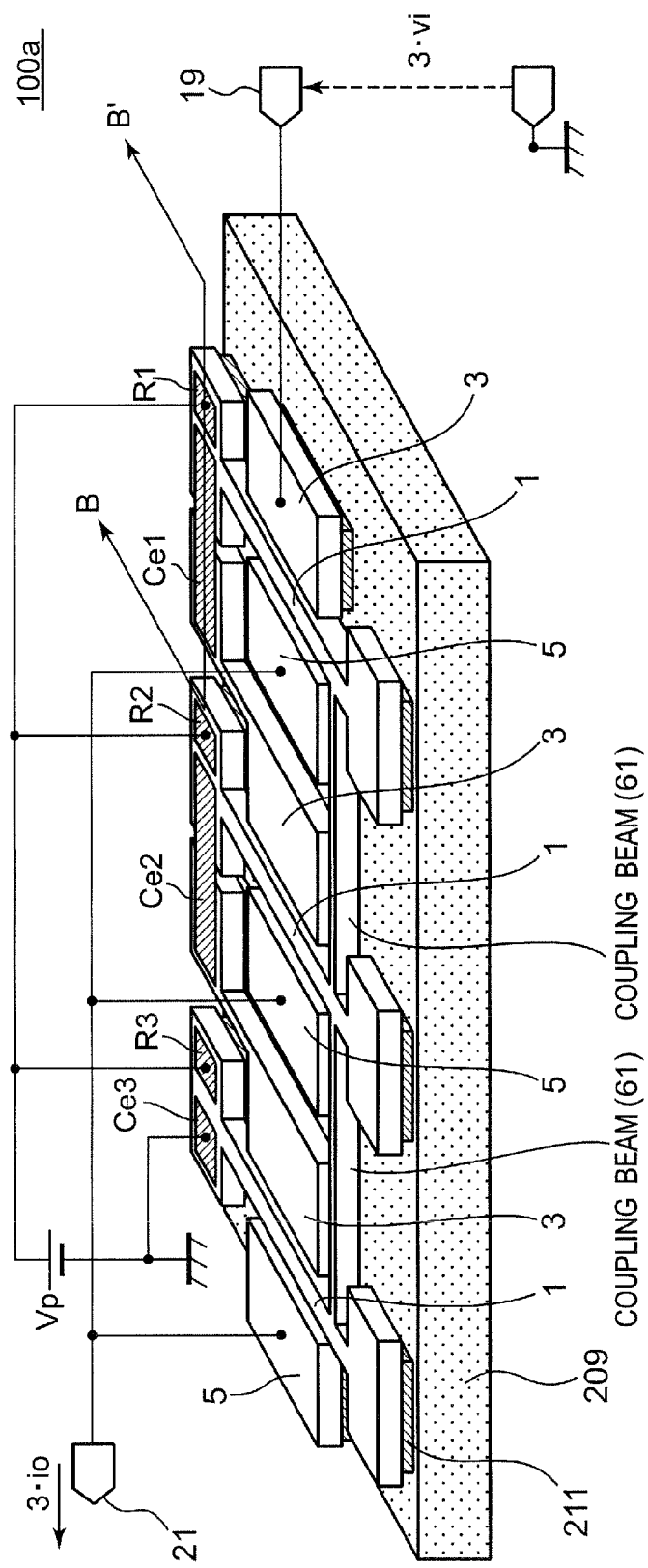
FIG. 9 is a perspective view of a MEMS resonator according to a second embodiment.

FIG. 9 is a perspective view of a MEMS resonator 100a according to a second embodiment. The MEMS resonator 100a is provided with three MEMS resonating units, and the vibrators 1 of the resonating units are mechanically coupled to one another by coupling beams 61. The vibrators 1 are coupled to each other by the coupling beam 61 at the vicinities of their fixed ends. In short, the coupling beam 61 constitutes a coupling unit that mechanically connects the vibrators 1 with each other.

"Tight coupling" and "loose coupling" using the coupling beam 61 are known as a mechanical coupling between the vibrators 1. Generally, the "tight coupling" represents the case where vicinities of "antinodes" of a vibrational mode of the vibrators 1 are coupled by a thin coupling beam, and the "loose coupling" represents the case where the vicinities of "nodes" of a vibrational mode of the vibrators 1 are coupled by a thin coupling beam or the case where the vicinities of the "nodes" are shared. The mechanical coupling in FIG. 9 is the loose coupling, but the tight coupling can also be used in the present embodiment. In the case of the loose coupling, it can be realized only by sharing the vicinities of the "nodes" of the vibrators 1. As a matter of course the vibrational mode of the vibrator 1 may be multiply-splitted. Hence, it is occasionally needed to add means for selectively using a desired mode. In the case of the tight coupling, since a joint member such as the coupling beam 61 is bridged between antinode regions where the vibrators 1 vibrates most, a joint that is so ultrafine as not to inhibit the vibration may be used, or the resonator may be designed in consideration of the mass of the joint member.

The vibrators 1 are mechanically coupled to each other by the coupling beam 61 as shown in FIG. 9, whereby the respective vibrators 1 do not operate independently and, hence, they can be regarded as one continuum. This then allows appropriate selection and use of the mechanical resonance mode in the vibrators that may be regarded as a continuum. In the coupling topology and the arrangement of driving electrodes (input electrode 3) of FIG. 9, a mode where the three vibrators 1 vibrate in the same phase in a direction along the substrate plane is strongly excited. In association with this, output currents io having the same phase are outputted from the resonators and bundled up and outputted as 3·io from the output port 21.

As thus described, the plurality of vibrators 1 can be regarded as one vibrator by mechanically coupling the vibrators 1 of the plurality of MEMS resonating units using the coupling beams 61. Accordingly, even in the case where the Q values of respective resonating units are high, difference among the mechanical resonance frequencies of the resonating units can be ignored.

In case that the vibrators are not mechanically coupled to one another using the coupling beams 61 as shown in FIG. 9, it would be occasionally afraid that the effect due to a large current power output capability, which has been acquired through the bundling up of the currents being generated in association with the vibrations and outputted from the output electrodes 5 and the outputting of the bundled current from the output port 21, may be impaired even if input signals of a certain frequency (signals provided by the input voltage applied to the input port 19) are given to the vibrators 1. This is because that, due to a difference of mechanical resonance frequencies of the vibrators 1 caused by a difference in size among the vibrators 1 due to processing error, there may be, among the plurality of vibrators 1, a vibrator(s) that actually strongly vibrates and also a vibrator(s) that does not vibrate owing to the deviation from its (their) mechanical resonance frequency especially when the Q values of the resonating units are very high (namely the sharpness of a resonance peak is high) such as a vacuum environment, which has a low atmosphere viscosity.

It is to be noted that, in FIG. 9, resistance elements R1, R2, and R3 are used as substitutes for the inductance element 15a etc. (inductance L) of FIG. 6 etc. Further, symbols Ce1, Ce2, and Ce3 in FIG. 9 denote additional capacitive elements, each of which works as the additional capacitive element 13a (capacity Ce) of FIG. 6 etc. Although a conformation can be taken where the resistive elements R1 to R3 and the additional capacitive elements Ce1 to Ce3 are arranged outside the substrate where the vibrators 1 are formed, the size of the resonator 100a itself can be reduced by forming those on the same substrate where the vibrators 1 are formed as shown in FIG. 9. Further, this eliminates the need for retrofitting a circuit part in the process of manufacturing the MEMS resonator.

Figure 10:
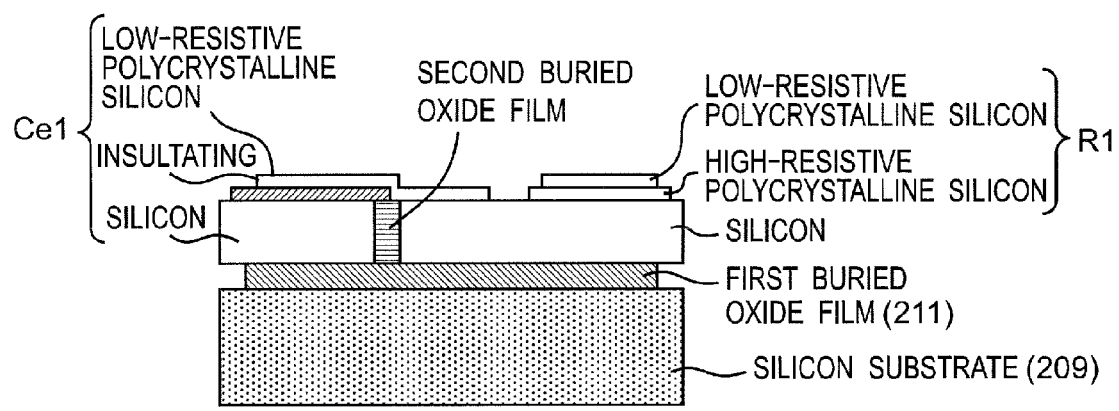
FIG. 10 is a sectional view along the line B-B' of FIG. 9.

FIG. 10 is a sectional view showing a cross-sectional structure along the line B-B' of FIG. 9, that is, the cross-sectional structure at the vicinity of the additional capacitive element Ce1 and the resistive element R1. There will be shown here an example of forming the MEMS resonator 100a using a SOI substrate where silicon is formed on the silicon substrate 209 with a first buried oxide film 211 interposed therebetween.

First, the topmost silicon layer is processed to bury a second buried oxide film into a gap. Next, the buried oxide film (not shown) deposited on the silicon substrate is removed by etching or polishing. On top of that, a high-resistive polycrystalline silicon film and a low-resistive polycrystalline silicon film are deposited to form the resistive element R1. Further, the additional capacitive element Ce1 can be formed through depositing an inslating film such as silicon nitride and a low-resistive poly crystalline silicon film.

Figure 11:
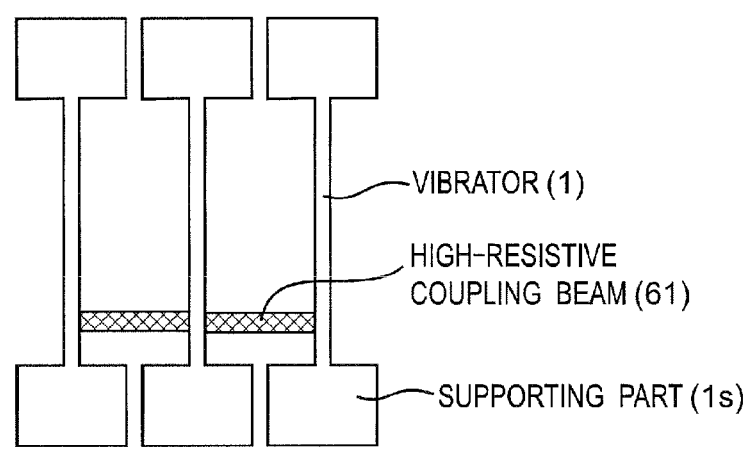
FIG. 11 is a top view of a vibrator of FIG. 9.

FIG. 11 is a top plan view of only the vibrator 1 in the resonator structure of FIG. 9. Three vibrators 1 and the coupling beams 61 mechanically coupled thereto may be of identical material in an identical layer. The vibrator 1 is preferably made of a material with high conductivity such as metal or low-resistive silicon. However, the vibrators 1 are short-circuited with each other, if the coupling beam 61 also has such conductivity. Then, the structure of FIG. 5 becomes unrealizable. Hence, it is preferable that the coupling beam may have insulation property or high resistance in part or entirely. When the coupling units between the vibrators 1 are conductor with high impedance or an insulator, it is possible to avoid the electrical short circuiting among the plurality of vibrators so that the serial connection of the plurality of the MEMS resonating units with respect to the input port and the parallel connection of the output electrodes with respect to the output port. For example, when the topmost silicon layer of the SOI substrate is high-resistive silicon, the coupling beam units resultantly become highly resistive. Then, conductive impurities may be diffused with high-density in vibrator 1 supporting parts is which are connected with the vibrators 1, the resistive elements R1 to R3, and the additional capacitance (additional capacitive elements) Ce1 to Ce3 to increase the conductivity and realize the structure of FIG. 9.

SUMMARY

The MEMS resonators according to the embodiments have: an input port that is applied with an input voltage; an output port that outputs an output current; and a plurality of (N (N is an integer greater than or equal to 2)) MEMS resonating units that are connected with the input port and the output port. Each of the MEMS resonating units is provided with: an input electrode that is connected to the input port; a vibrator that is opposed to the input electrode with a gap interposed therebetween; and an output electrode that is opposed to the vibrator with a gap interposed therebetween. The plurality of input electrodes are then serially connected to the input port.

Alternatively, in the MEMS resonators according to the embodiments, the N MEMS resonating units each include: an electrode; and a vibrator that is opposed to the electrode with a gap interposed therebetween. Then, an electrode of at least one MEMS resonating unit among the plurality of MEMS resonating units and a vibrator(s) of the other MEMS resonating unit(s) are serially connected to the input port.

In other words, The N MEMS resonating units are serially connected to the input port in the MEMS resonators according to the embodiments. With such a configuration, the voltage that is applied to each of the MEMS resonating units is substantially identical to a voltage obtained by dividing the input voltage applied to the input port into N. It is thereby made possible to raise the minimal input voltage by which the MEMS resonating unit exhibits nonlinear resonance, so that an input voltage margin until the MEMS resonator starts to perform the nonlinear resonance can be expanded.

Further, when forming an oscillator using the MEMS resonators according to the present embodiments, the oscillator (FIG. 4) has excellent noise characteristics (an effect derived from a large current output capability) and provides with waveform shapability (an effect derived from high voltage resistance) can be configured.

It is to be noted that the vibrator of the MEMS resonators according to the embodiments may be a fixed beam with its both ends fixed or a cantilever beam, or may be a variety of types such as a disc type, a ring type, or a square type. The vibrator 1 is not limited to a beam. Further, when electrostatic force is applied to the vibrator 1, a deflecting vibration mode of the beam constituting the vibrator is excited. However, a torsional vibration mode can also be utilized. Furthermore, the method for manufacturing the MEMS resonators according to the embodiments is not limited to an approach where the SOI substrate is used.

The MEMS resonators according to the embodiments can be utilized for a resonator, a filter, an oscillator, a gyroscope, a pressure sensor, a mass detector element, etc.

INDUSTRIAL APPLICABILITY

The MEMS resonators according to the embodiments have a plurality of MEMS resonating units serially-connected with respect to the input port on the input side and parallelly-connected with respect to the output port on the output side. This allows expanding a input voltage margin until each resonating unit starts to exhibit a nonlinear behavior. For this reason, it can be utilized in a variety of industrial fields such as an oscillator, in which the linear property of the MEMS resonator is utilized, a filter, a gyroscope, a pressure sensor, an optical scanner, a mass detector element, etc.

REFERENCE SIGNS LIST

1: vibrator
3: input electrode
5: output electrode
7: input-side capacitance
9: output-side capacitance
11a: MEMS resonating unit
11b: MEMS resonating unit
11c: MEMS resonating unit
11va: MEMS resonating unit
11vb: MEMS resonating unit
11vc: MEMS resonating unit
13a: additional capacitance
13b: additional capacitance
13c: additional capacitance
15a: inductance element
15b: inductance element
15c: inductance element
19: input port
21: output port
61: high-resistive coupling beam
63: amplifier
85: MEMS resonator
99: MEMS resonating unit
100: MEMS resonator
100a: MEMS resonator
100v: MEMS resonator
Ce1: additional capacitive element
Ce2: additional capacitive element
Ce3: additional capacitive element
R1: resistive element
R2: resistive element
R3: resistive element

The invention claimed is:

1. A MEMS resonator, comprising:
an input port that is applied with an input voltage;
an output port that outputs an output current; and
N MEMS resonating units, each of the N MEMS resonating units including a vibrator and being connected to the input port and output port, and N being an integer greater than or equal to 2,
wherein the N MEMS resonating units are serially connected to the input port,
wherein in each of the N MEMS resonating units, the vibrator and an electrode that is opposed to the vibrator with a gap interposed therebetween form an input-side capacitance,
wherein the input-side capacitance of at least one of the N MEMS resonating units is connected with an input-side capacitance of another one of the MEMS resonating units via an additional capacitive element,
wherein the input-side capacitance of the at least one of the MEMS resonating units and the input-side capacitance of the other one of the MEMS resonating units are serially connected to the input port via the additional capacitive element, and
wherein the additional capacitive element has capacitance higher than the input-side capacitances of the N MEMS resonating units.

2. The MEMS resonator according to claim 1, wherein the N MEMS resonating units have a substantially identical mechanical resonance frequency.

3. The MEMS resonator according to claim 1, wherein the vibrators of the N MEMS resonating units are mechanically coupled to one another by coupling units.

4. The MEMS resonator according to claim 3, wherein the coupling unit has electrical impedance higher than a resistance value of the vibrators of the N MEMS resonating units.

5. The MEMS resonator according to claim 1, wherein the additional capacitive element, the at least one of the MEMS resonating units, and the other one of the MEMS resonating units are formed on a single substrate.

6. The MEMS resonator according to claim 1, further comprising an impedance element that defines a direct current potential of a wiring between the input-side capacitance of the at least one of the MEMS resonating units and the additional capacitive element,
wherein impedance of the impedance element is higher than impedance of the additional capacitive element.

7. The MEMS resonator according to claim 6, wherein the impedance element and the at least one of the MEMS resonating units are formed on a single substrate.

8. The MEMS resonator according to claim 1, wherein the N MEMS resonating units are connected in parallel to the output port.

9. An oscillator, comprising the MEMS resonator according to claim 1.

* * * * *